(12) United States Patent
Ohtomo et al.

(10) Patent No.: US 8,149,978 B2
(45) Date of Patent: Apr. 3, 2012

(54) CLOCK/DATA RECOVERY CIRCUIT

(75) Inventors: Yusuke Ohtomo, Tokyo (JP); Jun Terada, Tokyo (JP); Kazuyoshi Nishimura, Tokyo (JP); Keiji Kishine, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 355 days.

(21) Appl. No.: 12/526,339

(22) PCT Filed: Jul. 20, 2007

(86) PCT No.: PCT/JP2007/064338
§ 371 (c)(1),
(2), (4) Date: Aug. 7, 2009

(87) PCT Pub. No.: WO2008/111241
PCT Pub. Date: Sep. 18, 2008

(65) Prior Publication Data
US 2010/0073058 A1    Mar. 25, 2010

(30) Foreign Application Priority Data

Mar. 12, 2007  (JP) .................................. 2007-061298
Mar. 23, 2007  (JP) .................................. 2007-075749

(51) Int. Cl.
*H03D 3/24*     (2006.01)
*H03K 3/017*    (2006.01)
(52) U.S. Cl. ........................................ 375/371; 327/175
(58) Field of Classification Search .................. 375/354, 375/371, 359, 360, 316, 324–326, 328; 327/100, 327/105, 107, 141, 165, 166, 167, 172, 173, 327/174, 175, 176
See application file for complete search history.

(56) References Cited

U.S. PATENT DOCUMENTS

| 6,121,805 A *   | 9/2000  | Thamsirianunt et al. ...... 327/175 |
| 6,188,738 B1 *  | 2/2001  | Sakamoto et al. ............ 375/371 |
| 6,967,514 B2 *  | 11/2005 | Kizer et al. ................. 327/175 |
| 7,453,388 B1 *  | 11/2008 | Gutnik et al. ................ 341/155 |
| 2004/0046596 A1*| 3/2004  | Kaeriyama et al. ........... 327/165 |
| 2005/0031065 A1*| 2/2005  | Gupta et al. ................. 375/371 |

FOREIGN PATENT DOCUMENTS

JP   09-023247 A    1/1997
JP   2002-343020 A  11/2002

OTHER PUBLICATIONS

Nogawa et al., "A10Gb/s Burst-Mode CDR IC in 0.13 μm CMOS", ISSCC 2005 Dig. Tech. Papers, pp. 228-229, 595, Aug. 2006.

* cited by examiner

*Primary Examiner* — David C. Payne
*Assistant Examiner* — Vineeta Panwalkar
(74) *Attorney, Agent, or Firm* — Blakely, Sokoloff, Taylor & Zafman

(57) ABSTRACT

A clock/data recovery circuit includes a data duty correction circuit which outputs corrected data by correcting the duty of input data in accordance with the level of a correction signal, a clock recovery circuit which generates a recovered clock in synchronism with the edge timing of the corrected data, a data decision circuit which performs data decision of the corrected data based on the recovered clock, and a data duty detection circuit which detects the duty of the corrected data based on the recovered clock and outputs the correction signal representing a duty correction amount to the data duty correction circuit.

17 Claims, 14 Drawing Sheets

FIG.4A RCK
FIG.4B $\overline{DCO}$
FIG.4C Q
FIG.4D SCO
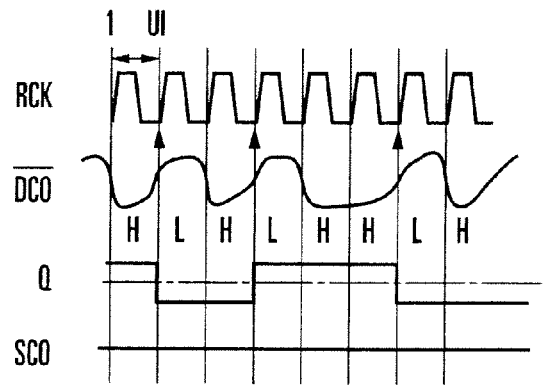
FIG.5A RCK
FIG.5B $\overline{DCO}$
FIG.5C Q
FIG.5D SCO
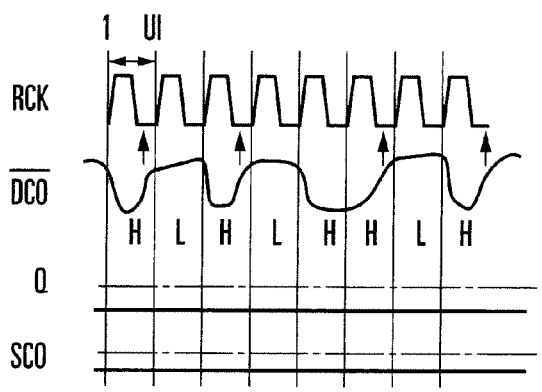
FIG.6A RCK
FIG.6B $\overline{DCO}$
FIG.6C Q
FIG.6D SCO
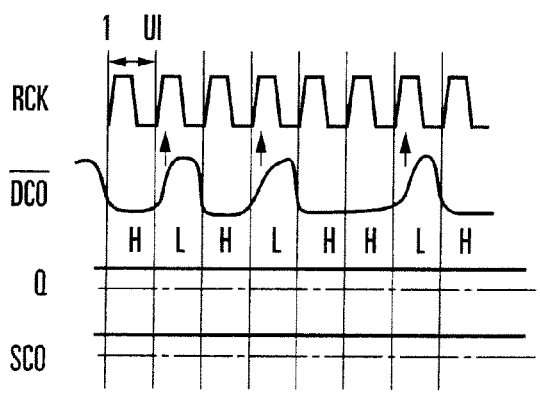

FIG.7A DIN
FIG.7B DIN2
FIG.7C DCO
FIG.8A DIN
FIG.8B SCO
FIG.8C DCO
FIG.8D RCK
FIG.8E DOUT
FIG.9A DIN
FIG.9B SCO
FIG.9C DCO
FIG.9D RCK
FIG.9E DOUT
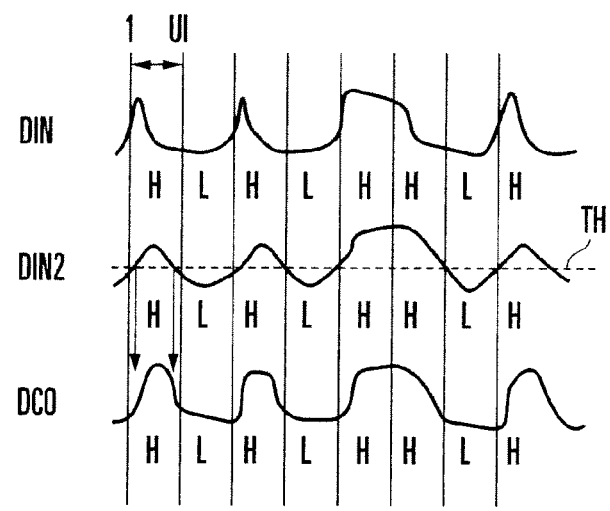
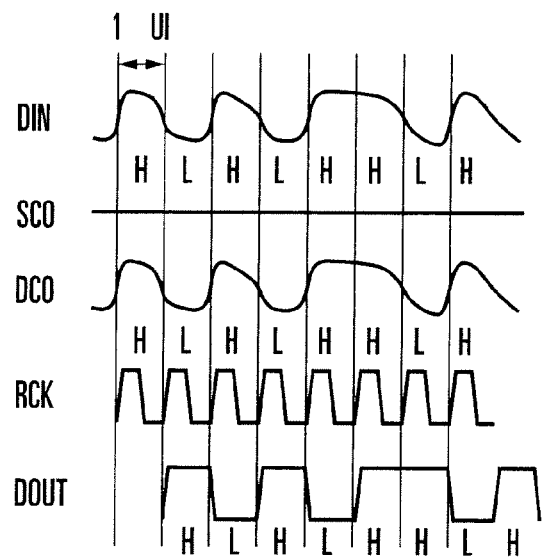
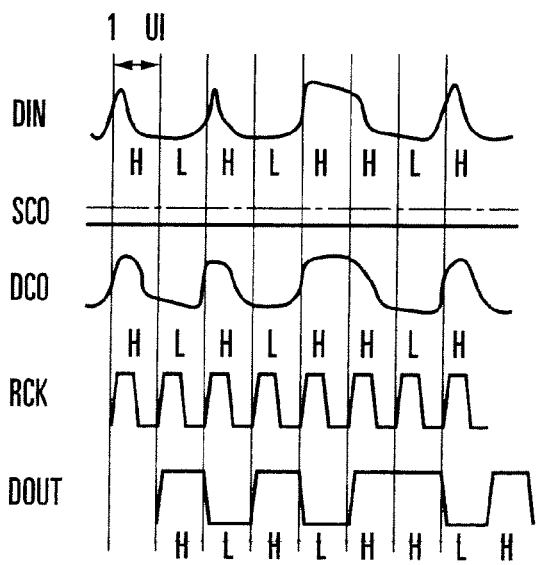

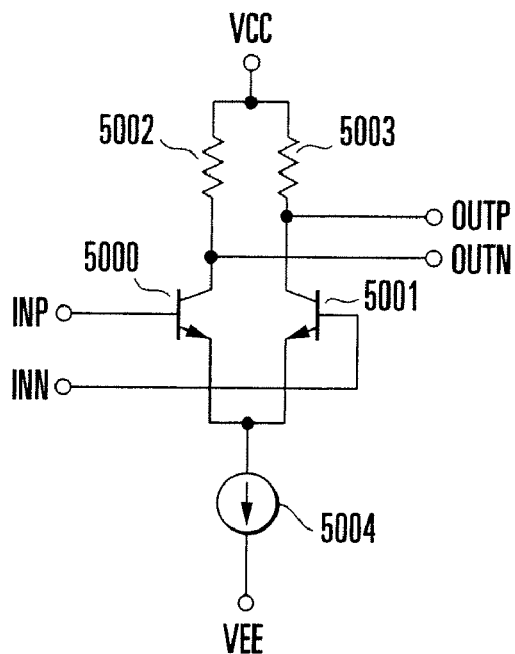
F I G. 20
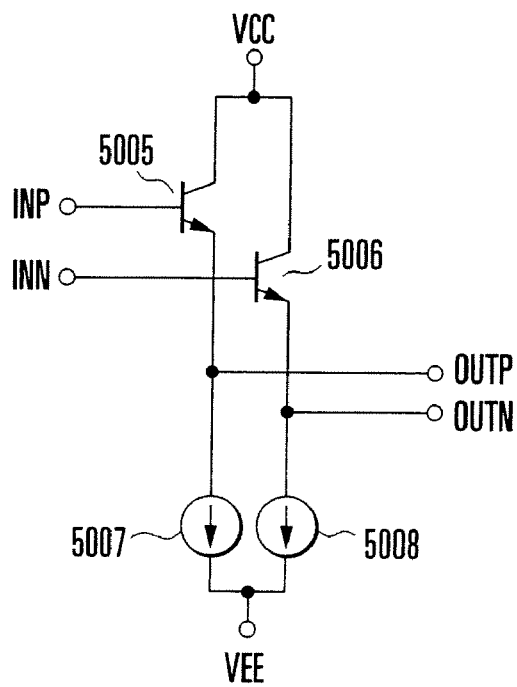
F I G. 21

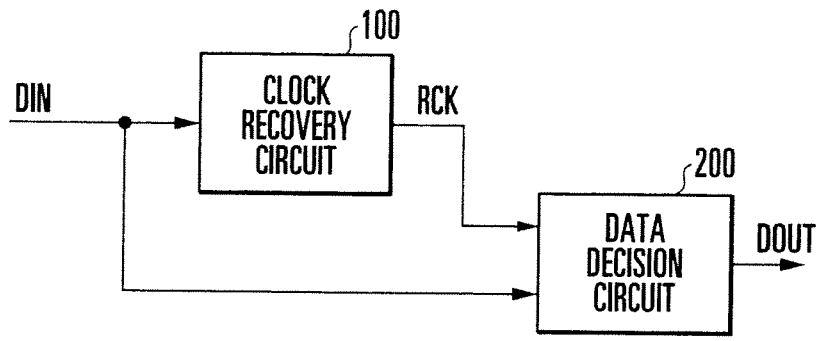
F I G. 23
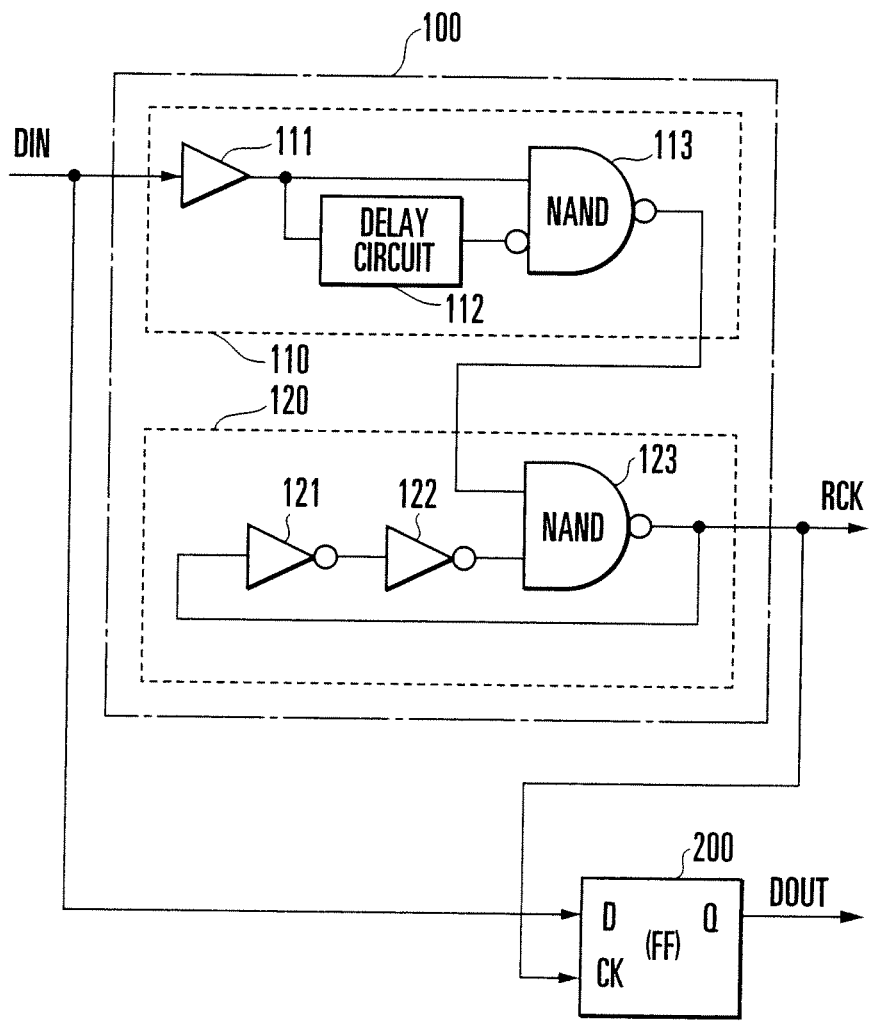
F I G. 24

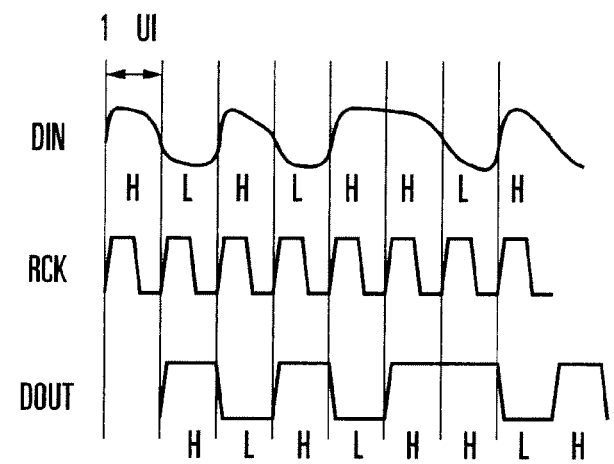
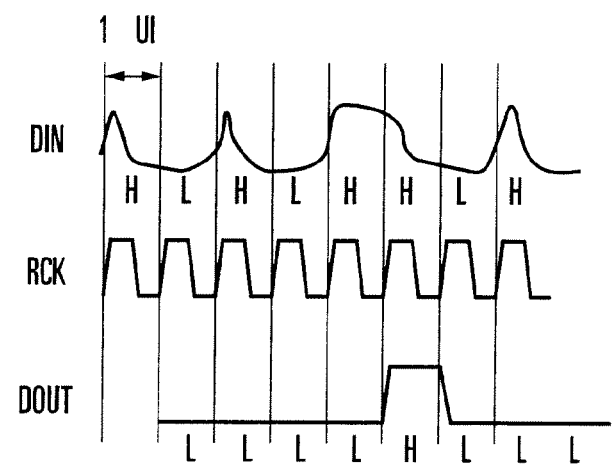

US 8,149,978 B2

CLOCK/DATA RECOVERY CIRCUIT

The present patent application is a national phase application of International Application No. PCT/JP2007/064338, filed Jul. 20, 2007.

TECHNICAL FIELD

The present invention relates to a clock/data recovery circuit which recovers a clock from input data having waveform fluctuations and identifies the input data based on the clock and, more particularly, to a clock/data recovery circuit which corrects the duty of input data and identifies it.

BACKGROUND ART

FIG. 23 shows the arrangement of a conventional clock/data recovery circuit. FIG. 24 shows its detailed arrangement. This clock/data recovery circuit is disclosed in, e.g., reference "M. Nogawa, et al., "A 10 Gb/s Burst-Mode CDR IC in 0.13 µm CMOS", ISSCC 2005 Dig. Tech. Papers, PP. 228-229, FIG. 12.5.4."

The conventional clock/data recovery circuit includes a clock recovery circuit 100 and a data decision circuit 200. For example, as shown in FIG. 24, the clock recovery circuit 100 includes a gating circuit 110 and a gated VCO (Voltage Controlled Oscillator) 120. The gating circuit 110 includes a buffer 111, a delay circuit 112, and a NAND circuit 113. The gated VCO 120 includes inverters 121 and 122 and a NAND circuit 123. The gating circuit 110 detects the rising edge of input data DIN. The gated VCO 120 generates a recovered clock RCK in phase with the rising edge of the input data DIN. The data decision circuit 200 is formed from a D flip-flop circuit.

The operation of the conventional clock/data recovery circuit will be described with reference to FIGS. 25A to 25C and 26A to 26C. FIGS. 25A to 25C show a case in which the duty of the input data DIN is 100%, and the conventional clock/data recovery circuit operates normally. The gating circuit 110 generates a pulse having a width of ½ UI (Unit Interval) at the rising edge of the input data DIN shown in FIG. 25A and inputs it to the NAND circuit 123 of the gated VCO 120, thereby making the phase of the recovered clock RCK match that of the input data DIN. As a result, the clock recovery circuit 100 outputs the recovered clock RCK in phase with the rising edge of the input data DIN (FIG. 25B). The data decision circuit 200 receives the input data DIN via a data input terminal D of the flip-flop circuit and the recovered clock RCK via a clock input terminal CK. The recovered clock RCK is in phase with the input data DIN. The flip-flop circuit included in the data decision circuit 200 shapes the waveform of the input data DIN starting from the falling edge of the recovered clock RCK and outputs recovered output data DOUT from an output terminal Q (FIG. 25C).

DISCLOSURE OF INVENTION

Problem to be Solved by the Invention

FIGS. 26A to 26C show a case in which the duty of the input data DIN is much lower than 100%, i.e., the time width of the input data DIN at H level is shorter than about ½ of 1 UI. In this case as well, the clock recovery circuit 100 outputs the recovered clock RCK (FIG. 26B).

Take notice of the H level portion of a data stream L-H-L in the input data DIN shown in FIG. 26A. The level of the input data DIN has already dropped from H to L during the fall time of the recovered clock RCK in FIG. 26B. For this reason, the flip-flop circuit which constitutes the data decision circuit 200 outputs a wrong data stream L-L-L in the output data DOUT.

FIGS. 26A to 26C illustrate an example when the input data DIN has a low duty. The wrong output data DOUT is also output when the duty of the input data DIN is much higher than 100%. For example, take notice of the L level portion of a data stream H-L-H in the input data DIN. The input data DIN has not gone L level yet during the fall time of the recovered clock RCK. For this reason, the flip-flop circuit included in the data decision circuit 200 outputs a wrong data stream H-H-H in the output data DOUT.

As described above, the conventional clock/data recovery circuit outputs wrong data if the duty of the input data DIN is largely different from 100%.

It is an object of the present invention to provide a clock/data recovery circuit capable of performing a normal data decision operation even when the duty of input data largely shifts from 100%.

Means of Solution to the Problem

A clock/data recovery circuit of the present invention comprises a data duty correction circuit which outputs corrected data by correcting a duty of input data in accordance with a level of a correction signal, a clock recovery circuit which generates a recovered clock in synchronism with an edge timing of the corrected data, a data decision circuit which performs data decision of the corrected data based on the recovered clock, and a data duty detection circuit which detects a duty of the corrected data based on the recovered clock and outputs the correction signal representing a duty correction amount to the data duty correction circuit.

EFFECTS OF THE INVENTION

As described above, according to the present invention, it is possible to perform a normal data decision operation even when the duty of input data largely shifts from 100%. More specifically, in the present invention, if the duty of input data is much different from 100%, it is possible to obtain a correction signal representing a duty correction amount changed in accordance with the difference of the duty of the input data from 100% regardless of whether the difference is fixed or varies over time. Correcting the duty of the input data in accordance with the correction signal enables a normal data decision operation. In the present invention, the duty of the input data is detected not using the average value of H level and L level of the data but by comparing the time position of the edge of the data with that of the recovered clock. This makes it possible to determine the end time of duty correction independently of the length of consecutive identical digits of the data. In the present invention, it is consequently possible to implement high-speed duty correction even for input data in which consecutive identical digits continue long. Additionally, in the present invention, digitizing the correction signal makes it possible to perform duty correction without largely depending on variations in devices such as a transistor while ensuring tolerance of noise that has arrived at the correction signal. This achieves a stable data decision operation.

BRIEF DESCRIPTION OF DRAWINGS

FIG. 4A is a timing chart showing the waveform of a recovered clock input to the data duty detection circuit in FIG. 2;

FIG. 4B is a timing chart showing the waveform of corrected data input to the data duty detection circuit in FIG. 2 at a duty of almost 100%;

FIG. 4C is a timing chart showing the waveform of the output from the flip-flop circuit of the data duty detection circuit in FIG. 2 when the duty of the corrected data is almost 100%;

FIG. 4D is a timing chart showing the waveform of a correction signal output from the data duty detection circuit in FIG. 2 when the duty of the corrected data is almost 100%;

FIG. 5A is a timing chart showing the waveform of a recovered clock input to the data duty detection circuit in FIG. 2;

FIG. 5B is a timing chart showing the waveform of corrected data input to the data duty detection circuit in FIG. 2 at a duty lower than 100%;

FIG. 5C is a timing chart showing the waveform of the output from the flip-flop circuit of the data duty detection circuit in FIG. 2 when the duty of the corrected data is lower than 100%;

FIG. 50 is a timing chart showing the waveform of a correction signal output from the data duty detection circuit in FIG. 2 when the duty of the corrected data is lower than 100%;

FIG. 6A is a timing chart showing the waveform of a recovered clock input to the data duty detection circuit in FIG. 2;

FIG. 6B is a timing chart showing the waveform of corrected data input to the data duty detection circuit in FIG. 2 at a duty higher than 100%;

FIG. 6C is a timing chart showing the waveform of the output from the flip-flop circuit of the data duty detection circuit in FIG. 2 when the duty of the corrected data is higher than 100%;

FIG. 6D is a timing chart showing the waveform of a correction signal output from the data duty detection circuit in FIG. 2 when the duty of the corrected data is higher than 100%;

FIG. 7A is a timing chart showing the waveform of input data input to the data duty correction circuit in FIG. 3;

FIG. 7B is a timing chart showing the waveform of output data from the buffer of the data duty correction circuit in FIG. 3;

FIG. 7C is a timing chart showing the waveform of corrected data from the data duty correction circuit in FIG. 3;

FIG. 8A is a timing chart showing the waveform of input data having a 100% duty and input to the clock/data recovery circuit in FIG. 1;

FIG. 8B is a timing chart showing the waveform of a correction signal generated by the clock/data recovery circuit in FIG. 1 when the duty of the input data is 100%;

FIG. 8C is a timing chart showing the waveform of corrected data generated by the clock/data recovery circuit in FIG. 1 when the duty of the input data is 100%;

FIG. 8D is a timing chart showing the waveform of a recovered clock generated by the clock/data recovery circuit in FIG. 1 when the duty of the input data is 100%;

FIG. 8E is a timing chart showing the waveform of output data output from the clock/data recovery circuit in FIG. 1 when the duty of the input data is 100%;

FIG. 9A is a timing chart showing the waveform of input data having a duty lower than 100% and input to the clock/data recovery circuit in FIG. 1;

FIG. 9B is a timing chart showing the waveform of a correction signal generated by the clock/data recovery circuit in FIG. 1 when the duty of the input data is lower than 100%;

FIG. 9C is a timing chart showing the waveform of corrected data generated by the clock/data recovery circuit in FIG. 1 when the duty of the input data is lower than 100%;

FIG. 9D is a timing chart showing the waveform of a recovered clock generated by the clock/data recovery circuit in FIG. 1 when the duty of the input data is lower than 100%;

FIG. 9E is a timing chart showing the waveform of output data output from the clock/data recovery circuit in FIG. 1 when the duty of the input data is lower than 100%;

FIG. 20 is a block diagram showing the arrangement of a buffer of the data duty decreasing circuit in FIG. 19;

FIG. 21 is a block diagram showing the arrangement of an emitter follower circuit of the data duty decreasing circuit in FIG. 19;

FIG. 23 is a block diagram showing the arrangement of a conventional clock/data recovery circuit;

FIG. 24 is a block diagram showing the detailed arrangement of the conventional clock/data recovery circuit in FIG. 23;

FIG. 25A is a timing chart showing the waveform of input data having a 100% duty and input to the clock/data recovery circuit in FIG. 23;

FIG. 25B is a timing chart showing the waveform of a recovered clock generated by the clock/data recovery circuit in FIG. 23 when the duty of the input data is 100%;

FIG. 25C is a timing chart showing the waveform of output data output from the clock/data recovery circuit in FIG. 23 when the duty of the input data is 100%;

FIG. 26A is a timing chart showing the waveform of input data having a duty lower than 100% and input to the clock/data recovery circuit in FIG. 23;

FIG. 26B is a timing chart showing the waveform of a recovered clock generated by the clock/data recovery circuit in FIG. 23 when the duty of the input data is lower than 100%; and FIG. 26C is a timing chart showing the waveform of output data output from the clock/data recovery circuit in FIG. 23 when the duty of the input data is lower than 100%.

BEST MODE FOR CARRYING OUT THE INVENTION

First Embodiment

Figure 1:
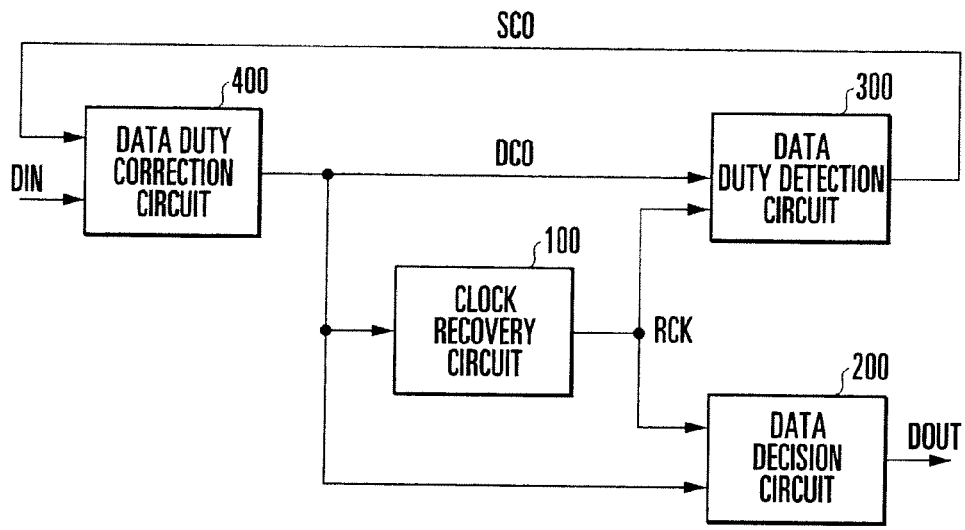
FIG. 1 is a block diagram showing the arrangement of a clock/data recovery circuit according to the first embodiment of the present invention.

FIG. 1 shows the arrangement of a clock/data recovery circuit according to the first embodiment of the present invention. A clock recovery circuit 100 and a data decision circuit 200 have the same circuit arrangements as in the prior art described with reference to FIGS. 23 and 24. Reference numeral 300 denotes a data duty detection circuit; and 400, a data duty correction circuit.

Figure 2:
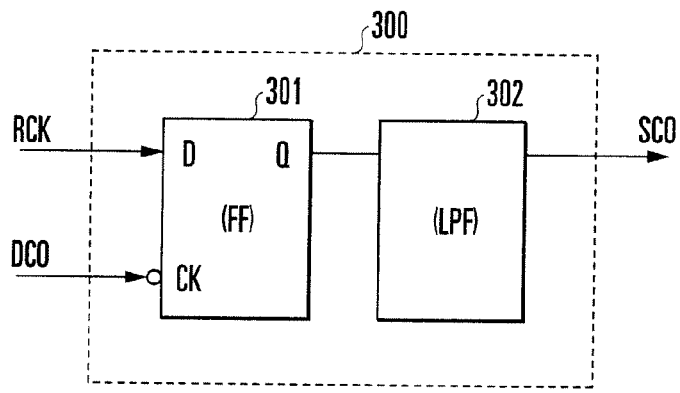
FIG. 2 is a block diagram showing the arrangement of the data duty detection circuit of the clock/data recovery circuit according shown in FIG. 1.

As shown in FIG. 2, the data duty detection circuit 300 includes a D flip-flop circuit 301 and a low-pass filter 302.

The data duty detection circuit 300 inputs a recovered clock RCK to a data input terminal D of the flip-flop circuit 301 and the inverted signal of corrected data DCO to a clock input terminal CK. An output terminal Q is connected to the input of the low-pass filter 302. The low-pass filter 302 outputs a correction signal SCO as the output of the data duty detection circuit 300.

Figure 3:
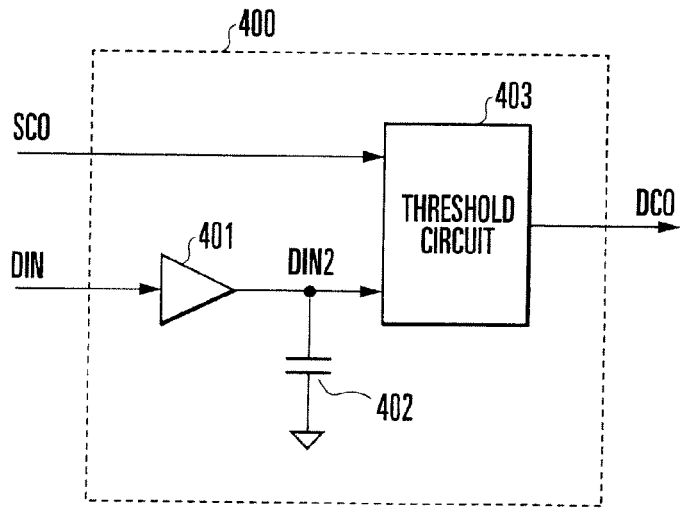
FIG. 3 is a block diagram showing the arrangement of the data duty correction circuit of the clock/data recovery circuit according shown in FIG. 1.

As shown in FIG. 3, the data duty correction circuit 400 includes a driver 401, a capacitor 402, and a threshold circuit 403. Input data DIN is connected to the input of the driver 401. The output of the driver 401 is connected to the capacitor 402 and the input of the threshold circuit 403. The other terminal of the capacitor 402 is connected to, e.g., GND. The driver 401 and the capacitor 402 form an integration circuit. The threshold circuit 403 determines the integrated value of the input data DIN using the correction signal SCO as a threshold and outputs the corrected data DCO as the output of the data duty correction circuit 400.

The operation of the data duty detection circuit 300 in FIG. 2 will be described with reference to FIGS. 4A to 4D, 5A to 5D, and 6A to 6D. FIGS. 4B, 5B, and 6B show $\overline{DCO}$ which is the inverted signal of the corrected data DCO output from the data duty correction circuit 400.

FIGS. 4A to 4D show a case in which the duty of the corrected data DCO is already almost 100%. The recovered clock RCK shown in FIG. 4A is in phase with the corrected data DCO shown in FIG. 4B. For this reason, the fall time of the inverted signal $\overline{DCO}$ of the corrected data DCO almost matches the rise time of the recovered clock RCK. At a 100% duty, the rising edge of the inverted signal $\overline{DCO}$ of the corrected data DCO appears at a point of time corresponding to a multiple of 1 UI by a natural number from an arbitrary point of the rise time of the data. This indicates that the rise time of the inverted signal $\overline{DCO}$ of the corrected data DCO also almost matches the rise time of the recovered clock RCK. Hence, the flip-flop circuit 301 outputs a signal of H level or L level to the output terminal Q at the rising edge of the inverted signal $\overline{DCO}$ of the corrected data DCO in accordance with slight fluctuations of the recovered clock RCK (FIG. 4C). The correction signal SCO that is the output of the data duty detection circuit 300 is obtained by time-averaging the output from the flip-flop circuit 301 by the low-pass filter 302. If the averaging time is long, the average value exhibits the intermediate value between H level and L level, and the correction signal SCO represents that the duty of the corrected data DCO is almost 100% (FIG. 4D).

On the other hand, assume that the duty of the corrected data DCO is lower than 100%, as shown in FIGS. 5A to 5D. In this case, the probability that the rising edge of the inverted signal $\overline{DCO}$ of the corrected data DCO shown in FIG. 5B is located during a time when the recovered clock RCK shown in FIG. 5A is L level rises. The output terminal Q of the flip-flop circuit 301 changes to L level at a higher probability (FIG. 5C). A voltage level obtained by time-averaging the output from the flip-flop circuit 301 by the low-pass filter 302 comes close to L level. As a result, the correction signal SCO represents that the duty of the corrected data DCO is lower than 100% (FIG. 5D).

Also, assume that the duty of the corrected data DCO is higher than 100%, as shown in FIGS. 6A to 6D. In this case, the probability that the rising edge of the inverted signal $\overline{DCO}$ of the corrected data DCO shown in FIG. 6B is located during a time when the recovered clock RCK shown in FIG. 6A is H level rises. The output terminal Q of the flip-flop circuit 301 changes to H level at a higher probability (FIG. 6C). A voltage level obtained by time-averaging the output from the flip-flop circuit 301 by the low-pass filter 302 comes close to H level.

As a result, the correction signal SCO represents that the duty of the corrected data DCO is higher than 100% (FIG. 6D).

As described above, at a duty lower than 100%, the data duty detection circuit 300 shown in FIG. 2 outputs the correction signal SCO having a voltage level lower than the central voltage level in accordance with the shift amount of the duty of the corrected data DCO from 100%. At a duty higher than 100%, the data duty detection circuit 300 outputs the correction signal SCO having a voltage level higher than the central voltage level.

The operation of the data duty correction circuit 400 shown in FIG. 3 will be described next with reference to FIGS. 7A to 7C. The capacitor 402 connected to the output of the driver 401 of the data duty correction circuit 400 stretches the rise time and fall time of the input data DIN shown in FIG. 7A so that the output from the driver 401 becomes data DIN2 (FIG. 7B). The threshold circuit 403 at the next stage uses the voltage level of the correction signal SCO as a threshold TH. When the voltage of the input data DIN2 exceeds the threshold TH, the threshold circuit 403 outputs the corrected data DCO of H level to the output terminal. When the voltage of the input data DIN2 is less than the threshold TH, the threshold circuit 403 outputs the corrected data DCO of L level to the output terminal (FIG. 7C).

The voltage level of the correction signal SCO at which the duty of output data DOUT is 100% when inputting a signal having a 100% duty as the input data DIN with respect to the input data DIN2 generated by stretching the rise time and fall time of the input data DIN is set as the central voltage of the correction signal SCO. If the voltage level of the correction signal SCO is lower than the central potential, the data duty correction circuit 400 outputs, as the corrected data DCO, a signal having a duty higher than that of the input data DIN. If the voltage level of the correction signal SCO is higher than the central potential, the data duty correction circuit 400 outputs, as the corrected data DCO, a signal having a duty lower than that of the input data DIN. That is, the data duty correction circuit 400 corrects the duty of the input data DIN in accordance with the level of the correction signal SCO and outputs the corrected data DCO.

The correction signal SCO output from the data duty detection circuit 300 is used as the threshold of the data duty correction circuit 400. The corrected data DCO output from the data duty correction circuit 400 is used as the input to the data duty detection circuit 300. With this arrangement, when the duty of the input data DIN is 100%, as shown in FIG. 8A, the correction signal SCO remains at the central potential (FIG. 8B). The input data DIN is directly output as the corrected data DCO (FIG. 8C). Hence, the clock/data recovery circuit according to the first embodiment normally operates, as in the prior art.

On the other hand, when the duty of the input data DIN is much lower than 100%, as shown in FIG. 9A, the correction signal SCO moves to a potential lower than the central potential (FIG. 9B). The input data DIN having a higher duty is output as the corrected data DCO (FIG. 9C). As a consequence, the clock/data recovery circuit according to the first embodiment outputs correct data, unlike the prior art.

Although not particularly illustrated, when the duty of the input data DIN is much higher than 100%, the correction signal SCO moves to a potential higher than the central potential. The input data DIN having a lower duty is output as the corrected data DCO. Hence, the clock/data recovery circuit according to the first embodiment outputs correct data, unlike the prior art.

The time required for data duty correction of the first embodiment will be explained. Although a conventional amplification circuit or the like averages input data itself to generate a correction signal corresponding to the time of H level and that of L level, such a correction signal is not used in the first embodiment. This is because in the conventional method, the potential variation of the correction signal largely depends on the length of consecutive identical digits of input data. More specifically, the longer the length of consecutive bits of input data is, the longer the averaging time needs to be set. Otherwise, the voltage level of the correction signal greatly varies up to the end of the continuous signal so that the duty also largely varies.

In the first embodiment, however, using matching of the rise times of the corrected data DCO and the recovered clock RCK, the data duty detection circuit 300 detects the duty of the input data DIN based on the relationship between the falling edge of the data and the rising edge of the recovered clock RCK only when data transition has occurred. In the first embodiment, this ensures the degree of freedom of design to allow data duty correction time determination independently of the length of consecutive identical digits of the input data DIN while focusing on only the variations in the average value of the output from the low-pass filter 302 of the data duty detection circuit 300. As a result, in the first embodiment, high-speed duty correction can be done even for the input data DIN in which consecutive identical digits continue long.

The characteristic features of the first embodiment will be summarized below. First, in the first embodiment, a normal data decision operation is possible even when the duty of the input data DIN largely shifts from 100%. More specifically, if the duty of the input data DIN is largely different from 100%, it is possible to obtain a duty correction amount changed in accordance with the duty difference from 100% within the designed range of the low-pass filter 302 of the data duty detection circuit 300 regardless of whether the difference is fixed or varies over time. The data duty correction circuit 400 corrects the duty of the input data DIN based on the correction signal SCO representing the duty correction amount. This enables a normal data decision operation. Next, in the first embodiment, the duty of the input data DIN is detected not using the average value of H level and L level of the data but by comparing the time position of the falling edge of the input data DIN with that of the recovered clock RCK. This makes it possible to determine the end time of duty correction independently of the length of consecutive identical digits of the input data DIN. In the first embodiment, it is consequently possible to implement high-speed duty correction even for the input data DIN in which consecutive identical digits continue long.

Second Embodiment

The second embodiment of the present invention will be described next with reference to FIG. 10. Unlike the first embodiment, a correction signal SCO output from a data duty detection circuit 300 is converted into a digital signal and then fed back to a data duty correction circuit 400. The correction signal SCO described in the first embodiment takes an intermediate value representing that the duty of the corrected data DCO is almost 100%, L level representing that the duty has lowered, and H level representing that the duty has risen.

Figure 10:
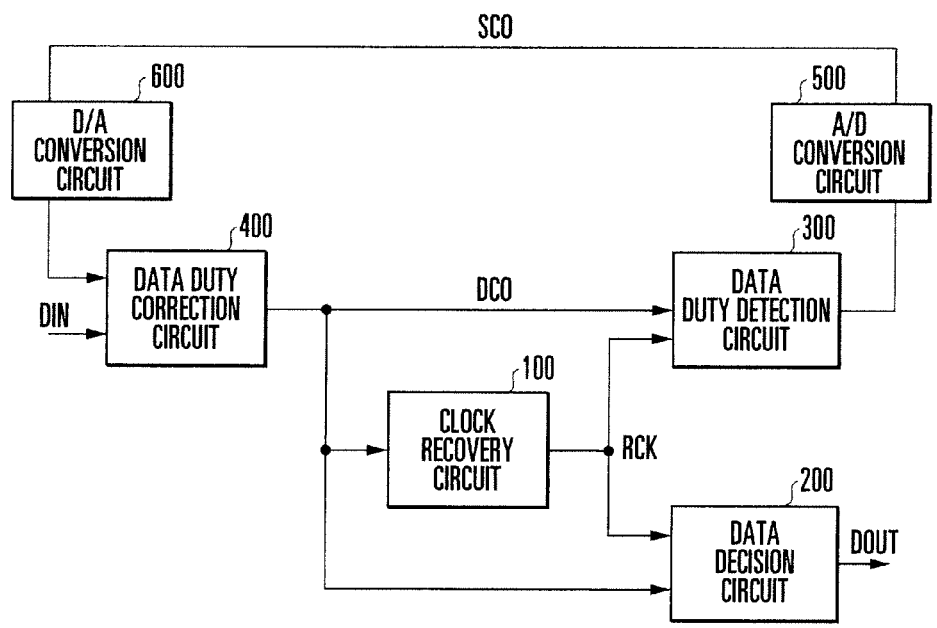
FIG. 10 is a block diagram showing the arrangement of a clock/data recovery circuit according to the second embodiment of the present invention.

An A/D conversion circuit 500 is added to the output of the data duty detection circuit 300, as shown in FIG. 10. A 2-bit digital signal LH represents that duty correction is unnecessary. LL represents that the duty needs to be higher. HH represents that the duty needs to be lower. A D/A conversion circuit 600 is added to the preceding stage of the data duty correction circuit 400. The D/A conversion circuit 600 generates an analog signal in accordance with the 2-bit signal and inputs it to the data duty correction circuit 400 as a threshold. This makes it possible to coarsely correct the duty not to cause a data decision circuit 200 to make any error. Increasing the number of digital bits of A/D conversion and D/A conversion from two to more so as to raise the conversion accuracy improves the duty correction accuracy.

In the second embodiment, it is possible to correct the duty without largely depending on variations in the devices such as a transistor while ensuring tolerance of noise that has arrived at the correction signal SCO. This achieves a stable data decision operation.

Third Embodiment

Figure 11:
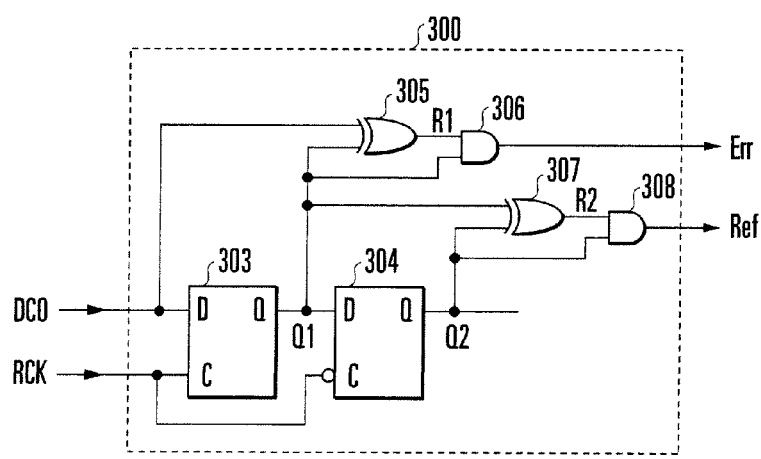
FIG. 11 is a block diagram showing the arrangement of a data duty detection circuit according to the third embodiment of the present invention.

The third embodiment of the present invention will be described next. FIG. 11 is a block diagram showing the arrangement of a data duty detection circuit 300 according to the third embodiment of the present invention. The data duty detection circuit 300 of this embodiment includes flip-flop circuits 303 and 304, exclusive-OR circuits 305 an 307, and AND circuits 306 and 308.

The data duty detection circuit 300 of this embodiment receives corrected data DCO and a recovered clock RCK having a frequency and phase in synchronism with those of the corrected data DCO, and outputs a signal Err whose pulse width indicates the difference of the duty of the corrected data DCO from 100% and a reference signal Ref representing a reference pulse width when outputting the signal Err.

The connection arrangement of the data duty detection circuit 300 of this embodiment will be explained next. The flip-flop circuit 303 receives the corrected data DCO via a data input terminal D and the recovered clock RCK via a clock input terminal C. The flip-flop circuit 304 receives, via the data input terminal D, an output signal Q1 from an output terminal Q of the flip-flop circuit 303 and the inverted clock of the recovered clock RCK via the clock input terminal C. The exclusive-OR circuit 305 receives the corrected data DCO and the output signal Q1 from the output terminal Q of the flip-flop circuit 303. The exclusive-OR circuit 307 receives the output signal Q1 from the output terminal Q of the flip-flop circuit 303 and an output signal Q2 from the output terminal Q of the flip-flop circuit 304. The AND circuit 306 receives the output signal from the exclusive-OR circuit 305 and the output signal Q1 from the output terminal Q of the flip-flop circuit 303, and outputs the signal Err. The AND circuit 308 receives the output signal from the exclusive-OR circuit 307 and the output signal Q2 from the output terminal Q of the flip-flop circuit 304, and outputs the reference signal Ref.

Figure 12:
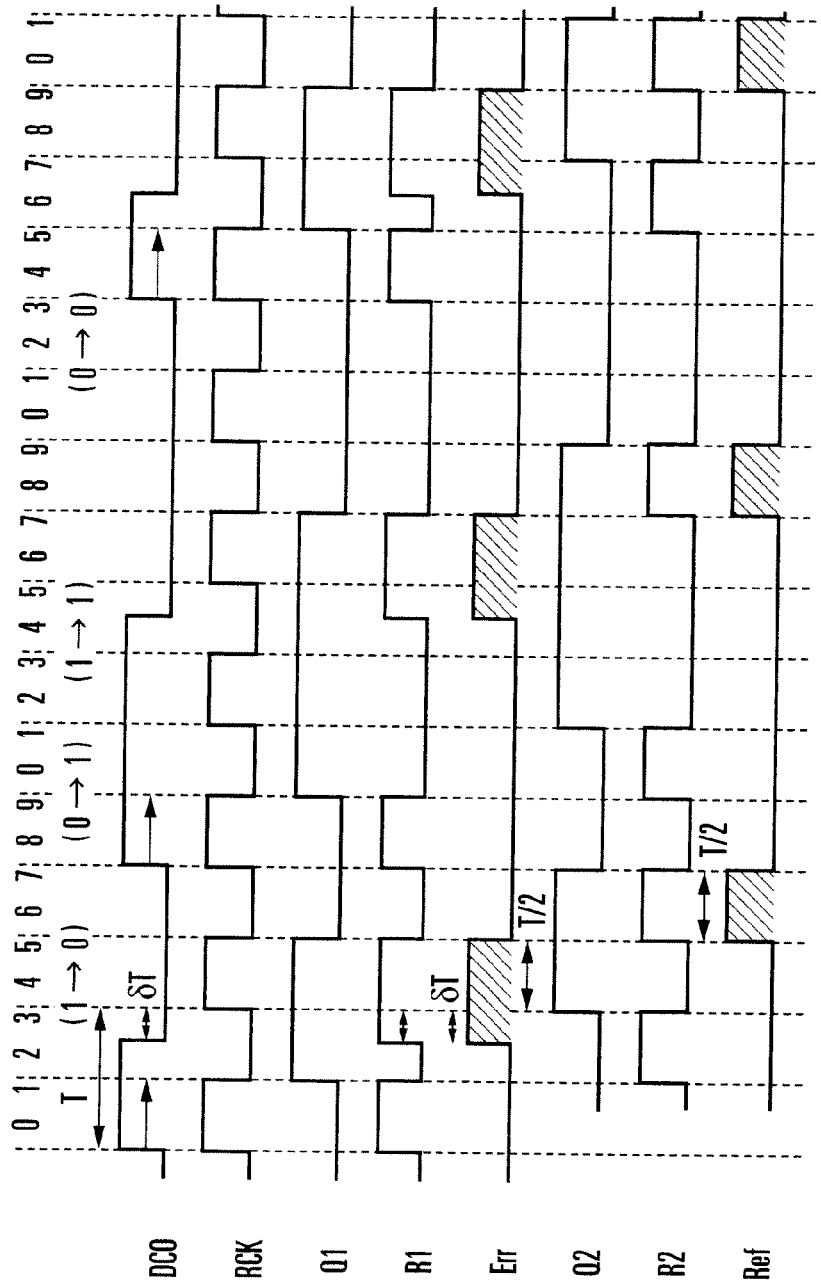
FIG. 12A is a timing chart showing the waveform of corrected data input to the data duty detection circuit in FIG. 11.
FIG. 12B is a timing chart showing the waveform of a recovered clock input to the data duty detection circuit in FIG. 11.
FIG. 12C is a timing chart showing the waveform of the output from the first flip-flop circuit of the data duty detection circuit in FIG. 11.
FIG. 12D is a timing chart showing the waveform of the output from the first exclusive-OR circuit of the data duty detection circuit in FIG. 11.
FIG. 12E is a timing chart showing the waveform of a signal output from the data duty detection circuit in FIG. 11.
FIG. 12F is a timing chart showing the waveform of the output from the second flip-flop circuit of the data duty detection circuit in FIG. 11.
FIG. 12G is a timing chart showing the waveform of the output from the second exclusive-OR circuit of the data duty detection circuit in FIG. 11.
FIG. 12H is a timing chart showing the waveform of a reference signal output from the data duty detection circuit in FIG. 11.

The duty detection operation of the data duty detection circuit 300 according to the embodiment will be described with reference to the timing charts shown in FIGS. 12A to 12H. FIGS. 12A to 12H show an example in which the corrected data DCO is input in the order of H, L, H, H, L, L, H, and L. When the duty of the corrected data DCO shown in FIG. 12A is 100%, the 1-bit data of H level continues for a unit time T. The difference of the duty of the corrected data DCO from 100% is represented by a time $\delta \cdot T$ which appears when the corrected data DCO changes from H level to L level. The duty is detected and indicated by making the difference time $\delta \cdot T$ from the 100% duty appear as an increase or decrease in the pulse width of the signal Err.

The data duty detection circuit 300 of this embodiment causes the flip-flop circuit 303 to receive the corrected data DCO in response to the recovered clock RCK and outputs the received corrected data DCO as the signal Q1 at the falling edge of the recovered clock RCK. The signal Q1 shown in FIG. 12C switches the H and L states at the falling edge of the recovered clock RCK shown in FIG. 12B. Hence, the signal Q1 is duty 100% data containing the same data stream as the corrected data DCO and but having a timing delayed by T/2. An output R1 from the exclusive-OR circuit 305 goes to H when the corrected data DCO and the signal Q1 represent different data (FIG. 12D). Since the signal Q1 is delayed from the corrected data DCO by T/2, the exclusive-OR circuit 305 outputs an H pulse at the leading and falling edges of the corrected data DCO. The pulse width at H level matches the delay time T/2 of the signal Q1. The pulse width at L level corresponds to a time obtained by adding/subtracting $\delta \cdot T$ as the duty variation amount of the corrected data DCO to/from the delay time T/2 of the signal Q1. The AND circuit 306 ANDs the signal Q1 and the output R1 from the exclusive-OR circuit 305 to eliminate the H pulse output at the rising edge of the corrected data DCO. For this reason, the signal Err output from the AND circuit 306 goes to H level only when transition of the corrected data DCO has occurred. Its pulse width represents the time obtained by adding/subtracting $\delta \cdot T$ as the difference from the 100% duty to/from T/2 (FIG. 12E). As is apparent from FIGS. 12A to 12H, only when the corrected data DCO shown in FIG. 12A transits from H level to L level, the signal Err goes to H level (FIG. 12E). The signal Err does not go to H if the data of H level or L level continues.

On the other hand, the signal Q1 is input to the flip-flop circuit 304. The flip-flop circuit 304 receives the data based on the inverted clock of the recovered clock RCK and therefore outputs the signal Q2 at the rising edge of the recovered clock RCK (FIG. 12F). The signal Q2 is delayed from the signal Q1 by T/2. The exclusive-OR circuit 307 exclusively ORs the signals Q1 and Q2 and outputs a pulse having a time width of T/2 (FIG. 12G). The AND circuit 308 ANDs an output R2 from the exclusive-OR circuit 307 and the signal Q2 to eliminate the pulse output at the rising edge of the signal Q1. For this reason, the AND circuit 308 outputs the reference signal Ref only when transition of the corrected data DCO has occurred. Its pulse width is T/2 (FIG. 12H). As is apparent from FIGS. 12A to 12H, only when the signal Q1 transits from H level to L level, the reference signal Ref goes to H level. The reference signal Ref does not go to H if the signal Q1 of H level or L level continues.

Figure 13:
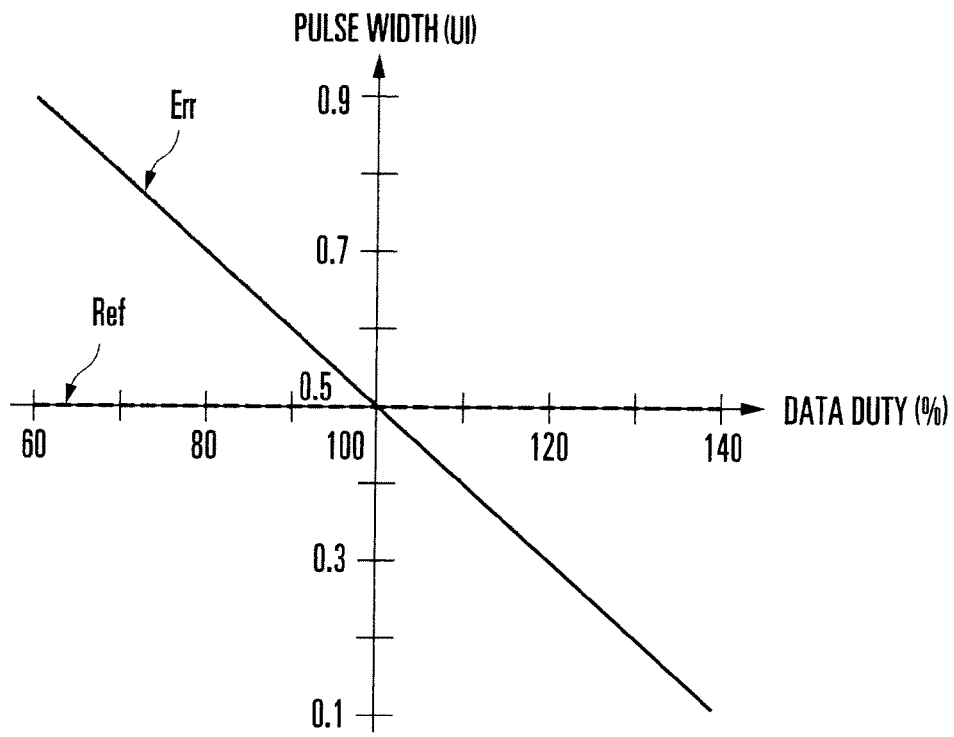
FIG. 13 is a graph showing the characteristics of the signal and the reference signal output from the data duty detection circuit in FIG. 11.

FIG. 13 is a graph showing the pulse widths (ratios to the unit time T) of the signals Err and Ref output from the data duty detection circuit 300 of this embodiment. When the duty of the corrected data DCO changes from 60% to 140%, the pulse width of the signal Err linearly changes from 0.9 to 0.1 and represents the duty. The signal Ref has a constant pulse width of 0.5 and represents T/2 as the reference of the pulse width when the corrected data DCO transits.

Figure 14:
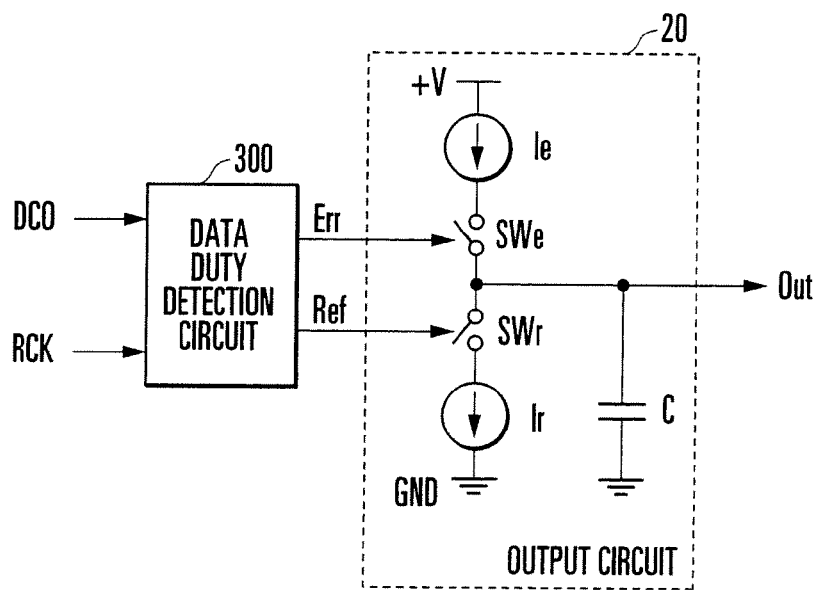
FIG. 14 is a block diagram showing the data duty detection circuit in FIG. 11 to which an output circuit is added.

Adding an output circuit 20 to the output of the data duty detection circuit 300 of this embodiment as shown in FIG. 14 enables to quickly and accurately detect the duty of the corrected data DCO. This will be described below. Referring to FIG. 14, the output circuit 20 which generates an output Out from the signals Err and Ref output from the data duty detection circuit 300 shown in FIG. 11 includes current sources Ie and Ir, switches SWe and SWr, and a capacitor C.

Figure 15A:
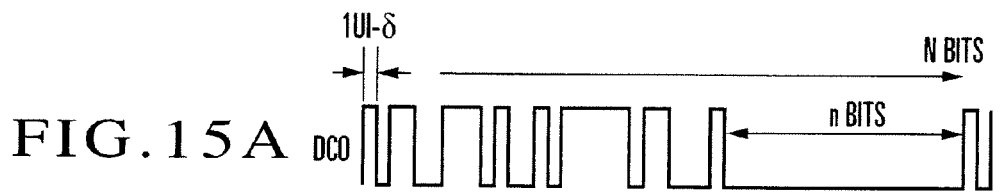
FIG. 15A is a timing chart showing the waveform of corrected data input to the data duty detection circuit in FIG. 14.

The current source Ie connected to the power supply charges the capacitor C with a constant current I. The current source Ir connected to GND discharges the constant current I from the capacitor C. Charge is done by turning on the switch SWe only during the H level time of the signal Err. Discharge is done by turning on the switch SWr only during the H level time of the reference signal Ref. When the corrected data DCO shown in FIG. 15A is input, the signal Err goes to H level only during the time obtained by adding δ·T representing the difference from the 100% duty to T/2 only when the corrected data DCO transits, as described with reference to FIGS. 12A to 12H. On the other hand, the reference signal Ref goes to H level during the time T/2 only when the corrected data DCO transits. When the signals Err and Ref go to H, the switches SWe and SWr are turned on for the corresponding times. If the corrected data DCO transits once, the capacitor C is charged with the current I during a time δ·T±T/2 and discharges the current I during the time T/2.

Figure 15B:
FIG. 15B is a timing chart showing the waveform of the output from the output circuit in FIG. 14.

Hence, the voltage across the capacitor C, i.e., the output Out from the output circuit 20 drops from a potential Vo by a voltage ΔV (FIG. 15B) given by $$\Delta V = -\eta \cdot \delta \cdot T \cdot I \cdot (1/C) \cdot N \tag{1}$$

where η is the transition probability of the corrected data DCO, N is the number of input bits, and I is the charge/discharge current of the capacitor C. Equation (1) indicates that the voltage difference ΔV is represented by the difference δ of the duty of the corrected data DCO from 100%.

As a characteristic feature of this embodiment, the signals Err and Ref go to H level only when the corrected data DCO transits. Even when the corrected data DCO with the consecutive identical digits continues, the switches SWe and SWr are kept ON to hold the potential of the capacitor C. In this embodiment, it is therefore possible to correctly indicate the difference δ of the duty of the corrected data DCO from 100% and quickly and accurately detect the duty.

Fourth Embodiment

Figure 16:
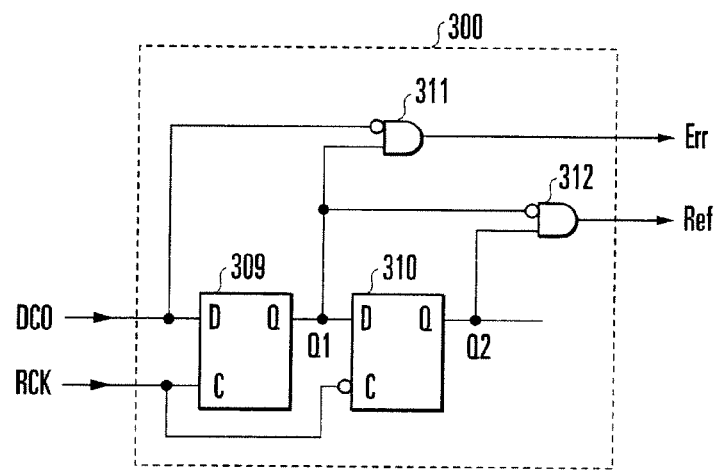
FIG. 16 is a block diagram showing the arrangement of a data duty detection circuit according to the fourth embodiment of the present invention.
Figure 17:
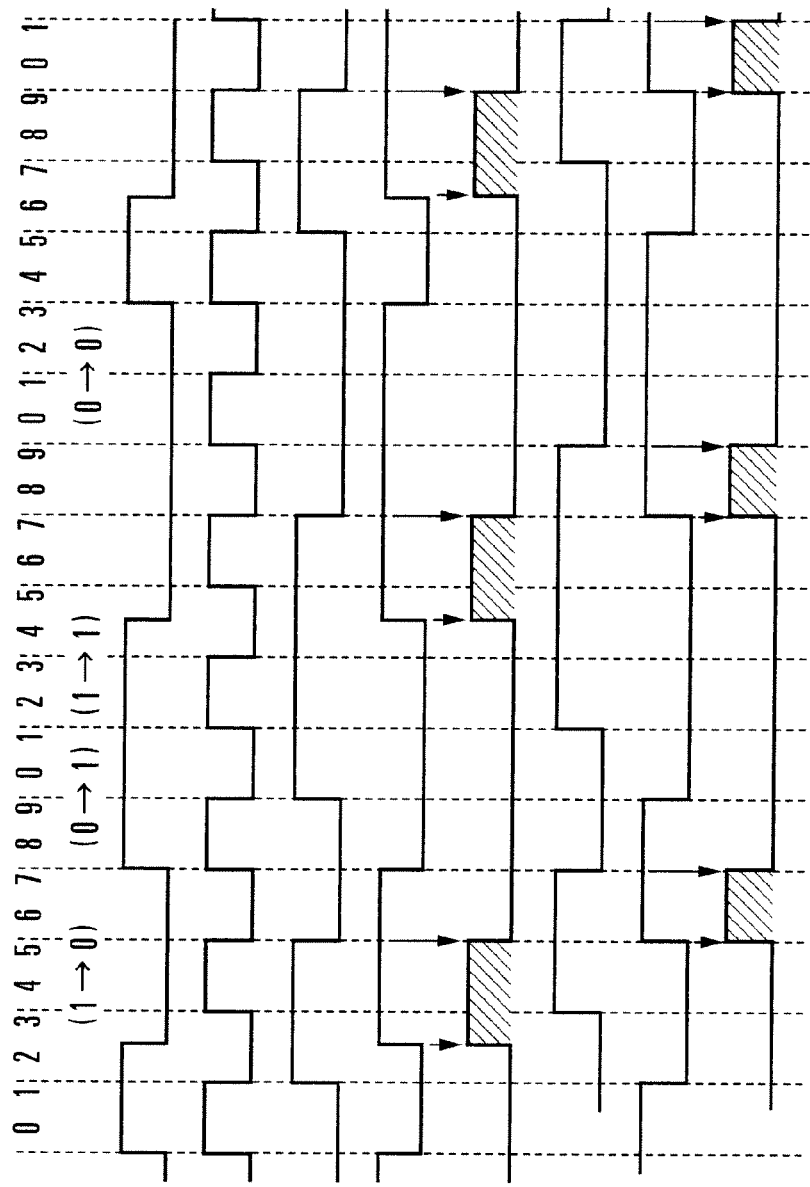
FIG. 17A is a timing chart showing the waveform of corrected data input to the data duty detection circuit in FIG. 16.
FIG. 17B is a timing chart showing the waveform of a recovered clock input to the data duty detection circuit in FIG. 16.
FIG. 17C is a timing chart showing the waveform of the output from the first flip-flop circuit of the data duty detection circuit in FIG. 16.
FIG. 17D is a timing chart showing the waveform of the input to the third AND circuit of the data duty detection circuit in FIG. 16.
FIG. 17E is a timing chart showing the waveform of a signal output from the data duty detection circuit in FIG. 16.
FIG. 17F is a timing chart showing the waveform of the output from the second flip-flop circuit of the data duty detection circuit in FIG. 16.
FIG. 17G is a timing chart showing the waveform of the input to the fourth AND circuit of the data duty detection circuit in FIG. 16.
FIG. 17H is a timing chart showing the waveform of a reference signal output from the data duty detection circuit in FIG. 16.

FIG. 16 shows a data duty detection circuit 300 according to the fourth embodiment of the present invention. The circuit of this embodiment is similar to that of the third embodiment, and a detailed description thereof will not be repeated. In the third embodiment, the data duty detection circuit uses the flip-flop circuits 303 and 304, the exclusive-OR circuits 305 and 307, and the AND circuits 306 and 308. The fourth embodiment enables to form the data duty detection circuit 300 using fewer circuits, i.e., flip-flop circuits 309 and 310 and AND circuits 311 and 312.

In this embodiment, it is possible to input corrected data DCO and a recovered clock RCK which are the same signals as in the third embodiment and output signals Err and Ref which are the same signals as in the third embodiment.

Fifth Embodiment

Figure 18:
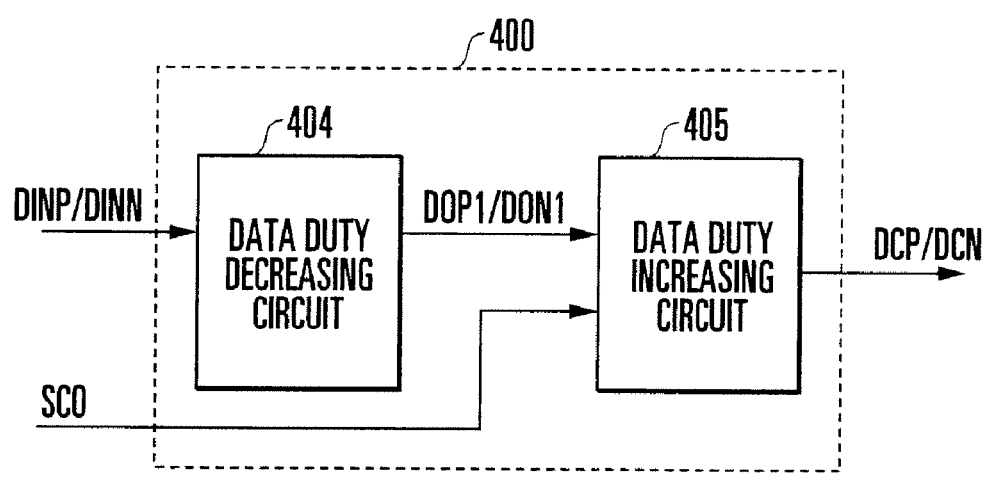
FIG. 18 is a block diagram showing the arrangement of a data duty correction circuit according to the fifth embodiment of the present invention.

FIG. 18 showing a data duty correction circuit 400 according to the fifth embodiment of the present invention. The data duty correction circuit 400 of this embodiment includes a data duty decreasing circuit 404 and a data duty increasing circuit 405. Note that this embodiment handles a differential signal. Input data DINP and DINN complementary to each other are input as input data DIN. Corrected data DCP and DCN complementary to each other are output as corrected data DCO.

The data duty decreasing circuit 404 decreases the duties of the input data DINP and DINN.

The data duty increasing circuit 405 increases the duties of outputs DOP1 and DON1 from the data duty decreasing circuit 404 in accordance with a correction signal SCO and outputs the corrected data DCP and DCN.

Figure 19:
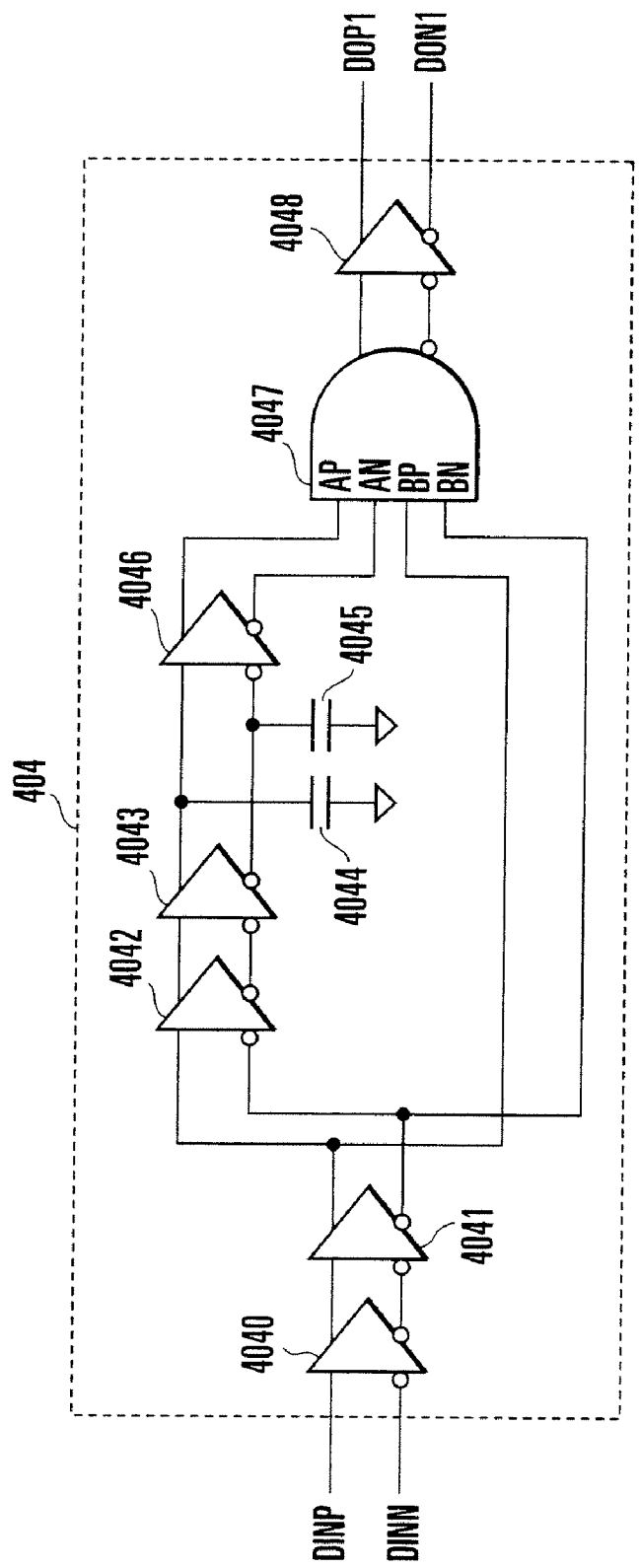
FIG. 19 is a block diagram showing the arrangement of the data duty decreasing circuit of the data duty correction circuit in FIG. 18.

FIG. 19 is a block diagram showing the arrangement of the data duty decreasing circuit 404. The data duty decreasing circuit 404 includes buffers 4040, 4042, and 4046, emitter follower circuits 4041, 4043, and 4048, capacitors 4044 and 4045, and an AND circuit 4047.

FIG. 20 is a block diagram showing the arrangement of the buffer 4040. The buffer 4040 includes transistors 5000 and 5001, resistors 5002 and 5003, and a current source 5004. Referring to FIG. 20, INP and INN are input signals complementary to each other. OUTP and OUTN are output signals complementary to each other. The remaining buffers 4042 and 4046 have the same arrangement as the buffer 4040.

FIG. 21 is a block diagram showing the arrangement of the emitter follower circuit 4041. The emitter follower circuit 4041 includes transistors 5005 and 5006, and current sources 5007 and 5008. The remaining emitter follower circuits 4043 and 4048 have the same arrangement as the emitter follower circuit 4041.

With the above-described arrangement, the data duty decreasing circuit 404 decreases the duties of the input data DINP and DINN and outputs the signals DOP1 and DON1 complementary to each other after decreasing the duties.

Figure 22:
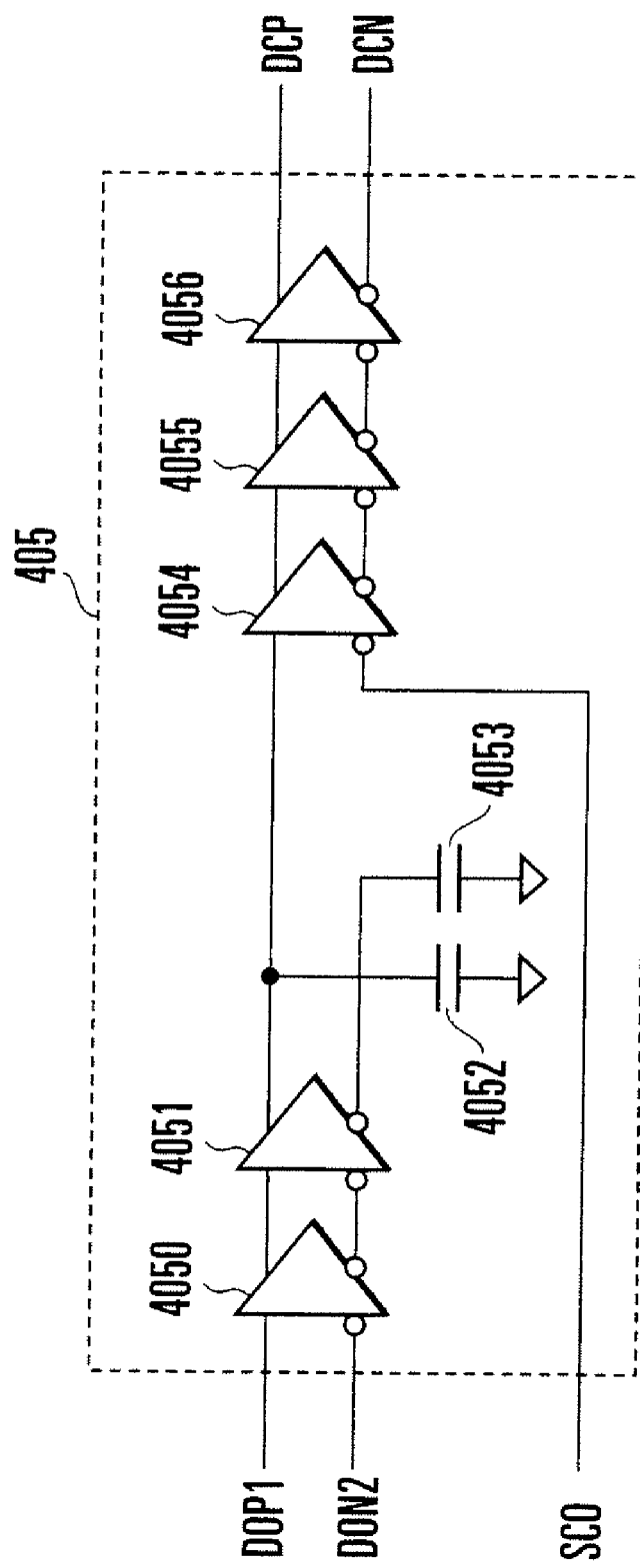
FIG. 22 is a block diagram showing the arrangement of the data duty increasing circuit of the data duty correction circuit in FIG. 18.

FIG. 22 is a block diagram showing the arrangement of the data duty increasing circuit 405. The data duty increasing circuit 405 includes buffers 4050, 4054, and 4055, emitter follower circuits 4051 and 4056, and capacitors 4052 and 4053. The buffers 4050, 4054, and 4055 have the same arrangement as the buffer 4040 shown in FIG. 20. The emitter follower circuits 4051 and 4056 have the same arrangement as the emitter follower circuit 4041 shown in FIG. 21.

With the above-described arrangement, the data duty increasing circuit 405 increases the duties of the outputs DOP1 and DON1 from the data duty decreasing circuit 404 in accordance with the correction signal SCO and outputs the corrected data DCP and DCN.

INDUSTRIAL APPLICABILITY

The present invention is applicable to a technique of recovering a clock from input data and identifying the input data based on the clock.

The invention claimed is:

1. A clock/data recovery circuit comprising:
  a data duty correction circuit which outputs corrected data by correcting a duty of input data in accordance with a level of a correction signal;
  a clock recovery circuit which generates a recovered clock in synchronism with and edge timing of the corrected data;
  a data decision circuit which performs data decision of the corrected data based on the recovered clock; and
  a data duty detection circuit which detects a duty of the corrected data based on the recovered clock and outputs the correction signal representing a duty correction amount to said data duty correction circuit, wherein said data duty detection circuit comprises:
  a flip-flop circuit which receives the recovered clock via a data input terminal and an inverted signal of the corrected data via a clock input terminal; and
  a low-pass filter which receives an output from said flip-flop circuit and outputs the correction signal.

2. A clock/data recovery circuit according to claim 1, further comprising:
  an A/D conversion circuit which is provided between said data duty detection circuit and said data duty correction circuit to convert the correction signal output from said data duty detection circuit into a digital signal; and
  a D/A conversion circuit which is provided between said data duty detection circuit and said data duty correction circuit to convert an output from said A/D conversion circuit into an analog signal and output the analog signal to said data duty correction circuit.

3. A clock/data recovery circuit according to claim 1, wherein said clock recovery circuit comprises:
a gating circuit which detects an edge of the corrected data; and
a gated VCO circuit which generates the recovered clock synchronized by an edge detection signal output from said gating circuit.

4. A clock/data recovery circuit according to claim 1, wherein said data duty correction circuit comprises:
an integration circuit which integrates the input data; and
a threshold circuit which determines an output from said integration circuit using the correction signal as a threshold and outputs the corrected data.

5. A clock/data recovery circuit according to claim 1, wherein said data duty correction circuit comprises:
a data duty decreasing circuit which decreases the duty of the input data; and
a data duty increasing circuit which increases a duty of an output from said data duty decreasing circuit in accordance with the correction signal and outputs the corrected data.

6. A clock/data recovery circuit comprising:
a data duty correction circuit which outputs corrected data by correcting a duty of input data in accordance with a level of a correction signal;
a clock recovery circuit which generates a recovered clock in synchronism with an edge timing of the corrected data;
a data decision circuit which performs data decision of the corrected based on the recovered clock; and
a data duty detection circuit which detects a duty of the corrected data based on the recovered clock and outputs the correction signal representing a duty correction amount to said data duty correction circuit, wherein said data duty detection circuit comprises means for receiving the corrected data and the recovered clock and outputting the correction signal representing a difference of the duty of the corrected data from 100% only when the corrected data transits.

7. A clock/data recovery circuit according to claim 6, wherein the correction signal representing the difference of the duty of the corrected data from 100% is a pulse signal having a time width obtained by adding/subtracting a time corresponding to the difference of the duty of the corrected data from 100% to/from a unit time corresponding to a 100% duty.

8. A clock/data recovery circuit according to claim 6, wherein said data duty detection circuit comprises:
a first flip-flop circuit which receives the corrected data in response to the recovered clock; and
a first logic circuit which outputs, based on the corrected data and an output signal from said first flip-flop circuit, a signal having a time width obtained by adding/subtracting, to/from a unit time, the difference of the duty of the corrected data for the unit time corresponding to a 100% duty when the corrected data transits.

9. A clock/data recovery circuit according to claim 8, wherein said data duty detection circuit comprises:
a second flip-flop circuit which receives the output signal from said first flip-flop circuit in response to an inverted clock of the recovered clock; and
a second logic circuit which outputs a signal having a pulse width corresponding to the unit time based on the output signal from said first flip-flop circuit and an output signal from said second flip-flop circuit only when the corrected data transits.

10. A clock/data recovery circuit according to claim 8, wherein said first logic circuit comprises:
a first exclusive-OR circuit which exclusively ORs the corrected data and the output signal from said first flip-flop circuit; and
a first AND circuit which ANDs an output signal from said first exclusive-OR circuit and the output signal from said first flip-flop circuit.

11. A clock/data recovery circuit according to claim 9, wherein said second logic circuit comprises:
a second exclusive-OR circuit which exclusively ORs the output signal from said first flip-flop circuit and the output signal from said second flip-flop circuit; and
a second AND circuit which ANDs an output signal from said second exclusive-OR circuit and the output signal from said second flip-flop circuit.

12. A clock/data recovery circuit according to claim 8, wherein said first logic circuit comprises a third AND circuit which ANDs an inverted signal of the corrected data and the output signal from said first flip-flop circuit.

13. A clock/data recovery circuit according to claim 9, wherein said second logic circuit comprises a fourth AND circuit which ANDs an inverted signal of the output signal from said first flip-flop circuit and the output signal from said second flip-flop circuit.

14. A clock/data recovery circuit according to claim 6, further comprising:
an A/D conversion circuit which is provided between said data duty detection circuit and said data duty correction circuit to convert the correction signal output from said data duty detection circuit into a digital signal; and
a D/A conversion circuit which is provided between said data duty detection circuit and said data duty correction circuit to convert an output from said A/D conversion circuit into an analog signal and output the analog signal to said data duty correction circuit.

15. A clock/data recovery circuit according to claim 6, wherein said clock recovery circuit comprises:
a gating circuit which detects an edge of the corrected data; and
a gated VCO circuit which generates the recovered clock synchronized by an edge detection signal output from said gating circuit.

16. A clock/data recovery circuit according to claim 6, wherein said data duty correction circuit comprises:
an integration circuit which integrates the input data; and
a threshold circuit which determines an output from said integration circuit using the correction signal as a threshold and outputs the corrected data.

17. A clock/data recovery circuit according to claim 6, wherein said data duty correction circuit comprises:
a data duty decreasing circuit which decreases the duty of the input data; and
a data duty increasing circuit which increases a duty of an output from said data duty decreasing circuit in accordance with the correction signal and outputs the corrected data.

* * * * *